(12) United States Patent
Miyake et al.

(10) Patent No.: US 8,274,208 B2
(45) Date of Patent: Sep. 25, 2012

(54) LIGHT-EMITTING DEVICE, VEHICULAR LIGHTING FIXTURE COMPRISING THE DEVICE, AND HEAD LAMP

(75) Inventors: Yasuyuki Miyake, Meguro-ku (JP); Shuichi Taya, Meguro-ku (JP); Akifumi Ochiai, Meguro-ku (JP); Hideyuki Emoto, Machida (JP); Masahiro Ibukiyama, Machida (JP)

(73) Assignees: Stanley Electric Co., Ltd., Tokyo (JP); Denki Kagaku Kogyo Kabushiki Kaisha, Tokyo (JP)

(*) Notice: Subject to any disclaimer, the term of this patent is extended or adjusted under 35 U.S.C. 154(b) by 404 days.

(21) Appl. No.: 12/682,076

(22) PCT Filed: Oct. 15, 2008

(86) PCT No.: PCT/JP2008/068667
§ 371 (c)(1),
(2), (4) Date: Apr. 8, 2010

(87) PCT Pub. No.: WO2009/051137
PCT Pub. Date: Apr. 23, 2009

(65) Prior Publication Data
US 2010/0208481 A1 Aug. 19, 2010

(30) Foreign Application Priority Data
Oct. 17, 2007 (JP) ................. 2007-269970

(51) Int. Cl.
*F21V 7/00* (2006.01)
*H01J 1/62* (2006.01)

(52) U.S. Cl. .............. 313/501; 257/98; 257/E33.061; 252/301.4 R

(58) Field of Classification Search ............ 313/503, 313/501; 349/62; 257/98, E33.061; 252/301.4 R; 423/263
See application file for complete search history.

(56) References Cited

U.S. PATENT DOCUMENTS
2006/0220047 A1 10/2006 Nagatomi et al.

FOREIGN PATENT DOCUMENTS
| JP | 2003-123517 | 4/2003 |
| JP | 2004-67837 | 3/2004 |
| JP | 2004-227968 | 8/2004 |
| JP | 2005-123165 | 5/2005 |
| JP | 2005-307012 | 11/2005 |
| JP | 2007-213862 | 8/2007 |

(Continued)

OTHER PUBLICATIONS
International Search Report issued in International Patent Application No. PCT/JP2008/068667 on Nov. 18, 2008.

(Continued)

*Primary Examiner* — Anh Mai
*Assistant Examiner* — Elmito Breval
(74) *Attorney, Agent, or Firm* — Stein McEwen, LLP

(57) ABSTRACT

A light-emitting device comprising a light source which emits excitation light and a fluorescent substance which absorbs the excitation light to emit light in combination, wherein a fluorescent substance comprising an α type SiAlON represented by the general formula: $(Ca_\alpha, Eu_\beta)(Si,Al)_{12}(O,N)_{16}$ ($1.5 < \alpha + \beta < 2.2$, $0 < \beta < 0.2$, $O/N \leq 0.04$) as a main component and having a specific surface area of 0.1 to 0.35 m$^2$/g is used as the fluorescent substance. This light-emitting device shows little color change due to temperature change and efficiently emits light, even when it is used in a high temperature environment, and it is especially suitable for lighting apparatuses for vehicles such as headlamps.

21 Claims, 5 Drawing Sheets

FOREIGN PATENT DOCUMENTS

WO  WO 2007/004492  1/2007

OTHER PUBLICATIONS

International Search Report issued in International Patent Application No. 08839484.6-1218 / 2202808 PCT/JP2008/068667 on Oct. 6, 2011.

Rong-Jun Xie et al.: "Optical properties of Eu2+ in a-SiAlON", *Journal of Physical Chemistry. B* (Online), American Chemical Society, Columbus, OH, US, vol. 108, No. 32, Jan. 1, 2004, pp. 12027-12031.

The International Search Report issued in International Patent Application No. 08839484.6-1218/2202808 PCT/JP2008/068667 on Oct. 6, 2011, was previously submitted in the Information Disclosure Statement filed Dec. 21, 2011.

JP 2003-123517, cited in the International Search Report submitted with the IDS filed Dec. 21, 2011, was previously submitted in an IDS filed Apr. 8, 2010.

JP 2007-213862, cited in the International Search Report submitted with the IDS filed Dec. 21, 2011, was previously submitted in an IDS filed Apr. 8, 2010.

LIGHT-EMITTING DEVICE, VEHICULAR LIGHTING FIXTURE COMPRISING THE DEVICE, AND HEAD LAMP

CROSS-REFERENCE TO RELATED APPLICATIONS

This application claims the benefit of PCT International Patent Application No. JP/2008/068667, filed Oct. 15, 2008, and Japanese Patent Application No. 2007-269970, filed Oct. 17, 2007, in the Japanese Patent Office, the disclosures of which are incorporated herein by reference.

TECHNICAL FIELD

The present invention relates to a light-emitting device comprising a semiconductor light-emitting diode (LED) and a novel fluorescent substance in combination, and an illuminator using it, especially a lighting apparatus for vehicles and headlamp emitting amber color light.

BACKGROUND ART

As lighting apparatuses for vehicles that emit amber color light, for example, direction indicators, those comprising electric bulbs colored in an amber color have been conventionally used. However, as those overcoming the drawbacks of electric bulbs, i.e., high power consumption and restriction on design for smaller size, those utilizing LEDs have been proposed and practically used.

As amber color LEDs, there are known AlGaInP semiconductors and GaAsP semiconductors showing an emission spectrum in the range of about 580 to 610 nm. However, these LEDs have a drawback that luminescence intensity thereof markedly decreases, as the ambient temperature becomes higher. For this reason, for use suffering from high ambient temperature such as rear combination lamps, a large number of amber LEDs must be provided in order to obtain required quantity of light, which leads to restriction on design of lighting apparatuses concerning increase in cost and reservation of installation space. Moreover, since turn signal lamps incorporated into headlamps locate near engines, and thus are exposed to especially high ambient temperature, required quantity of light cannot be secured with the aforementioned amber LEDs.

There have also been proposed lighting apparatuses that realize an amber color by a combination of a blue LED and a fluorescent substance that emits light of a long wavelength upon excitation with light emitted by the LED (Patent document 1). Patent document 1 describes use of $(Ca,Sr)_2Si_5N_8$:Eu as the fluorescent substance for long wavelength to be combined with a blue LED.

However, since this fluorescent substance shows a full width at half maximum of about 100 nm, and emits a lot of long wavelength components of low visibility, it suffers from a problem of low efficiency. Moreover, since it shows a persistence characteristic, it suffers from a problem that afterglow in non-emitting periods reduces visibility when it is used with blinking. Furthermore, an optical filter is indispensable for the amber color lighting apparatus described in Patent document 1 for shielding light emitted by LED.

Patent document 1: Japanese Patent Unexamined Publication (KOKAI) No. 2005-123165

DISCLOSURE OF THE INVENTION

Object to be Achieved by the Invention

An object of the present invention is to provide a light-emitting device which efficiently emits light with less color change depending on change of temperature even when it is used in a high temperature environment. Another object of the present invention is to provide a lighting apparatus for vehicles exhibiting superior visibility by using such a light-emitting device as mentioned above.

Means for Achieving the Object

According to the present invention, the aforementioned objects are achieved by using a novel fluorescent substance in a light-emitting device comprising LED and a fluorescent substance in combination.

The light-emitting device of the present invention comprises an LED which emits excitation light and a fluorescent substance which absorbs the excitation light to emit light in combination, wherein a fluorescent substance comprising an α type SiAlON represented by the general formula: $(Ca_\alpha, Eu_\beta)(Si,Al)_{12}(O,N)_{16}$ ($1.5 < \alpha+\beta < 2.2$, $0 < \beta < 0.2$, $O/N \leq 0.04$) as a main component is used as the fluorescent substance. In particular, it is characterized in that such an α type SiAlON as mentioned above having a specific surface area of 0.1 to 0.35 $m^2/g$ is used.

Chromaticity of light emitted by the light-emitting device is preferably in the range defined as $x \geq 0.545$, $y \geq 0.39$, and $y \leq x-0.12$ in terms of the chromaticity coordinates (CIE 1931).

The lighting apparatus for vehicles of the present invention uses the aforementioned light-emitting device.

BEST MODE FOR CARRYING OUT THE INVENTION

Hereafter, embodiments of the light-emitting device and lighting apparatus for vehicles of the present invention will be explained.

First, the fluorescent substance constituting the light-emitting device of the present invention will be explained in detail.

The α type SiAlON used for the light-emitting device of the present invention is an Eu-activated Ca-α-SiAlON fluorescent substance represented by the general formula: $M_z(Si,Al)_{12}(O,N)_{16}$, wherein Ca is used as the element M, and Eu serving as a luminescence center is introduced as a part of it. Eu-activated Ca-α-SiAlON fluorescent substances are generally excited with light of a broad wavelength range of from ultraviolet to blue to emit visible light of from yellow to orange. However, the SiAlON fluorescent substance used in the present invention realizes emission of long wavelength light of orange to red by reducing oxygen content in the SiAlON crystals and increasing solid-solution concentration of Ca (including Eu). Specifically, it emits light of an amber color by excitation with light of a wavelength in the range of 420 to 480 nm.

The α type SiAlON fluorescent substance mentioned above can be prepared by, for example, subjecting a raw material powdery mixture consisting of (a) silicon nitride, (b) aluminum nitride, (c) a Ca-containing compound, (d) an Eu-containing compound, and (e) an α type SiAlON to a heat treatment at 1650 to 1850° C. in a nitrogen atmosphere to obtain an α type SiAlON, and obtaining powder having a mean particle diameter of 15 to 25 μm only by classification. This method is characterized in that the α type SiAlON (e) is incorporated into the raw material powdery mixture, and powder having a mean particle diameter of 15 to 25 μm is obtained only by classification, and a fluorescent substance obtained by this method has a small specific surface area, and shows superior emission efficiency, small temperature dependency for color of light to be emitted, and small color change even in a high temperature environment.

The total molar ratio of Ca and Eu ($\alpha+\beta$) in the fluorescent substance exceeds 1.5, and does not exceed 2.2. With ($\alpha+\beta$) of 1.5 or smaller, it is difficult to obtain fluorescence with a peak wavelength of 595 nm or longer. With ($\alpha+\beta$) exceeding 2.2, the secondary phase adversely affecting fluorescence characteristics comes to be more easily generated. Further, solid-solution amount of Eu (value of $\beta$) is less than 0.2. If it is 0.2 or larger, the fluorescence peak wavelength shifts, thus it becomes difficult to obtain an amber color, and emission efficiency also decreases.

The ratio of oxygen and nitrogen, O/N, is 0.04 or smaller. If it exceeds 0.04, not only it becomes difficult to obtain fluorescence with a peak wavelength of 595 nm or longer, but also solid-solution limits of Ca and Eu decrease to make it difficult to realize $\alpha+\beta>1.5$.

The aforementioned fluorescent substance is obtained in the form of powder (particles), and particles preferably having a specific surface area of 0.1 to 0.35 $m^2$/g, more preferably 0.1 to 0.3 $m^2$/g, are used. If the specific surface area is larger than 0.35 $m^2$/g, primary particles do not fully develop, or fluorescent substance particle surfaces have unevenness, and as a result, high emission efficiency of 60% or more cannot be obtained. If the specific surface area is smaller than 0.1 $m^2$/g, particle diameters become too large, which may invite inconvenience such as clogging of a nozzle of dispenser used at the time of assembling the light-emitting device.

In the present invention, values of the specific surface area are values obtained by BET multipoint analysis performed on the basis of measurement according to the BET method.

The light-emitting device of the present invention has the same configuration as that of known light-emitting devices except that the aforementioned a type SiAlON fluorescent substance is used as a fluorescent substance, and the structure and the type thereof are not particularly limited.

As the first embodiment, a typical light-emitting device to which the present invention is applied is shown in FIG. 1. In this light-emitting device, electrodes 4 and 5 for both anode/cathode are provided on a lamp house 3 consisting of an insulating material such glass fibers and an epoxy resin, and an LED 2 is fixed on the lamp house 3 with an adhesive such as an epoxy resin. Electrodes for anode/cathode of LED 2 are each electrically connected to corresponding leader electrodes 4 and 5 with a conductive wire 6. A concave is formed at an approximate center position of the lamp house 3, and an orange fluorescent substance and a resin 1 are filled in the concave to constitute a light-emitting element.

As the blue LED 2, a known blue LED having a peak wavelength in the range of 420 to 480 nm can be used. Specific examples include GaN type compound semiconductors, InGaN type compound semiconductors, ZnO type compound semiconductors, ZnSe type compound semiconductors, and so forth.

The resin to be filled in the concave as a sealing material may be a material that is transparent for a wavelength range shorter than the emission peak wavelength of LED 2, and can be mixed with the fluorescent substance. Specific examples include thermosetting resins, photocurable resins, low melting point glass, and so forth. Thermosetting resins such as epoxy resins, silicone resins, polydimethylsiloxane derivatives having epoxy groups, oxetane resins, acrylic resins, and cycloolefin resins are especially preferred. These resins can be used alone, or one or more kinds of them may be used as a mixture.

Chromaticity of light emitted by the light-emitting device of the present invention is preferably in the range defined as $x \geq 0.545$, $y \geq 0.39$, and $y \geq x - 0.12$ in terms of the chromaticity coordinates (CIE 1931). Such chromaticity can be realized by a combination of a blue LED having a peak wavelength in the range of 420 to 480 nm and the a type SiAlON fluorescent substance mentioned above. However, a fluorescent substance other than the amber color fluorescent substance mentioned above may also be contained so long as the chromaticity does not deviate from the range defined above.

As the other fluorescent substance, generally known fluorescent substances such as europium-activated $M_2SiO_4$ (M=Mg, Ca, Sr, Ba), europium-activated $M_2Si_5N_8$ (M=Mg, Ca, Sr, Ba), europium-activated $M_3SiO_5$ (M=Mg, Ca, Sr, Ba), europium-activated $MAlSiN_3$ (M=Mg, Ca, Sr, Ba), and cerium-activated $A_3B_5O_{12}$ (A=Y, Gd, Lu, Tb, B=Al, Ga) can be used independently, or two or more kinds of them can be used as a mixture. Further, if needed, a scattering agent such as barium sulfate, magnesium oxide and silicon oxide may be mixed in the material for wavelength conversion for enhancing reflection of excitation light and light of which wavelength is converted by the material.

The fluorescent substance can be used by mixing it in the aforementioned resin in an appropriate amount. Although the amount to be mixed in the resin is not particularly limited, it is usually about 1 to 50% by weight, preferably about 5 to 20% by weight, based on the resin. The fluorescent substance may also be dispersed in the lamp house 3.

As for the structure of the lamp house 3, blue LED 2, and electrodes 4 and 5, it is sufficient that the blue LED 2 is fixed on the lamp house 3, and the leader electrodes for anode/cathode are each electrically connected to corresponding anode/cathode electrodes of LED 2, and they may have various configurations other than that shown in FIG. 1. For example, although not shown as drawings, they may have a configuration that the anode/cathode electrodes of LED 2 and corresponding leader electrodes are electrically connected and fixed on the lamp house 3 with a eutectic material such as that of Au—Sn, a conductive resin of which typical examples include Au bump, anisotropic conductive sheet, Ag paste etc, or the like, a configuration that one of the electrodes of LED 2 is electrically connected to a corresponding leader electrode and fixed on the lamp house 3 with any of the aforementioned materials, and the other electrode and a corresponding leader electrode are electrically connected with a conductive wire, or the like. Furthermore, in order to improve heat radiation property for LED 2, the lamp house 3 may be constituted with a conductive material such as a metal so that it can also serve as the leader electrode 5 for one of the electrodes.

On the surface of the concave formed in the lamp house 3, a highly reflective material may be formed by application, plating, deposition, or the like. Although it is desirable that the concave has an approximate truncated circular cone shape, it may have an approximate square pyramid shape. Although the sidewall of the concave desirably inclines, it may be substantially perpendicular depending on use.

The light-emitting device of the present invention shows little color change and good emission efficiency even in a high temperature environment, since it uses the specific Eu-activated Ca-$\alpha$ type SiAlON fluorescent substance as a fluorescent substance to be excited by light emitted by a blue LED. The light-emitting device of the present invention can be made to have an emission spectrum in which an area of a region for a wavelength of 500 nm or shorter consists of 5% or less of the total area of the emission spectrum by using an LED having a light-emitting peak wavelength of 420 to 480 nm and the aforementioned α type SiAlON fluorescent substance. Moreover, the full width at half maximum of the main peak in the emission spectrum of the light-emitting device is 100 nm or smaller. Because of these characteristics, it can realize chromaticity in the range defined as $x \geq 0.545$, $y \geq 0.39$, and $y \leq x - 0.12$ in terms of the chromaticity coordinates (CIE 1931) without using an optical filter for shielding light of a wavelength of 500 nm or shorter, or the like.

Moreover, as for change of chromaticity, chromaticity change amounts can be made to satisfy $\Delta x \leq 0.03$ and $\Delta y \leq 0.03$ in terms of change of the chromaticity coordinates (CIE 1931) within an environmental temperature range of from −20 to 85° C.

Hereafter, the lighting apparatus for vehicles of the present invention and the headlamp comprising it will be explained.

FIG. 2 shows an example of the lighting apparatus for vehicles of the present invention. This lighting apparatus comprises a light-emitting element 21, a supporting part 22 which supports the light-emitting element 21, a reflector 23 having an approximately circular arc shape, and an outer lens 24 disposed so as to face the reflector 23. The light-emitting element 21 is a light-emitting element 21 having the same structure as that of the light-emitting device shown in FIG. 1, and is fixed on the supporting part 22 so that the upper surface of the light-emitting element having the filled fluorescent substance should face the direction substantially perpendicular to a line connecting the light-emitting element 21 and the lens 24 to prevent outer lights from directly irradiating the light-emitting element 21. The light-emitting element 21 is connected to a power supply part not shown in the drawing. The reflector 23 is for reflecting lights emitted by the light-emitting element 21 to the direction of the lens 24, and at least the surface thereof facing the light-emitting element 21 consists of a metal or a white material. For example, a film of metal such as aluminum or a film of white pigment is formed on the surface by deposition, application, or the like. Moreover, although it is not shown in the drawing, an optical filter for adjusting tint may be disposed as required between the outer lens and the light-emitting element.

Because of such a structure, color of the optical filter or the outer lens cannot be seen from the outside when the light-emitting element 21 does not emit light. When light is emitted, light reflected by the reflector 23 is irradiated outside through the lens 24. Therefore, colors (appearances) at the time of light emission and no light emission completely differ to provide favorable visibility.

The lighting apparatus for vehicles of the present invention can be used for various lighting apparatuses for vehicles such as, for example, on-vehicle turn signal lamps, rear combination lamps, car room illumination lamps, meter illumination, and switch illumination. FIG. 3 shows an example of a headlamp to which the present invention is applied. FIG. 3, (a) is a front view thereof, and (b) is a sectional view along A-A. This headlamp is constituted by plural lighting apparatuses including a high beam ramp 31, low beam ramps 32 and 33, a position ramp 34, and a turn signal lamp 35. Although the light-emitting device of the present invention can be applied to any of these lighting apparatuses, it is suitable for, in particular, on-vehicle turn signal lamps, for which color range of amber color is standardized in each country. The color range of amber color used for on-vehicle turn signal lamps is standardized as an orange range of $0.429 \geq y \geq 0.398$ and $z \leq 0.007$ ($z = 1 - x - y$, xyz means the chromaticity coordinates) in JIS D5500 in Japan, and as $y \geq 0.39$, $y \geq 0.79 - 0.67x$, and $y \leq x - 0.12$ in the ECE rules in Europe. In the United States, it is standardized as $y = 0.39$, $y = 0.79 - 0.67x$, and $y \leq x - 0.12$ in SAE J578c and J578d.

Since the light-emitting element 21 used in the lighting apparatus for vehicles of the present invention can realize a chromaticity range of $x \geq 0.545$, $y \geq 0.39$, and $y \leq x - 0.12$ in terms of the chromaticity coordinates (CIE 1931), it can provide an on-vehicle turn signal lamp satisfying the aforementioned specifications.

Moreover, since the light-emitting device (light-emitting element 21) itself can realize chromaticity within the standardized range as the light source of the lighting apparatus for vehicles of the present invention, the lighting apparatus for vehicles of the present invention enables manufacture of turn signal lamps without use of optical filters. Since it does not use any optical filter, light emission loss is decreased, and efficiency is also improved.

EXAMPLES

Hereafter, examples of the present invention will be explained.

1. Preparation of α Type SiAlON Fluorescent Substance

Silicon nitride powder (61.2 mass %), aluminum nitride powder (22.1 mass %), calcium nitride powder (9.5 mass %), calcium fluoride powder (5.0 mass %), and europium oxide powder (2.2 mass %) were mixed in a mortar, put into a boron nitride crucible, and subjected to a heat treatment at 1750° C. for 16 hours under a nitrogen atmosphere of atmospheric pressure in an electric furnace having a carbon heater. As a result of powder X-ray diffractometry, it was confirmed that the powder obtained by the heat treatment was α type SiAlON.

The powder obtained by the heat treatment (α type SiAlON, 15 mass %), silicon nitride powder (53 mass %), aluminum nitride powder (19.1 mass %), calcium nitride powder (11 mass %), and europium oxide powder (1.9 mass %) were mixed, put into a boron nitride crucible, and subjected to a heat treatment at 1750° C. for 16 hours under a nitrogen atmosphere in an electric furnace having a carbon heater. The obtained sample was subjected to sieve classification, and powder which passed through a 45-μm mesh was used as a fluorescent substance for producing light-emitting devices.

Crystalline phase of this fluorescent substance was examined by powder X-ray diffractometry, and it was found that the existing crystalline phase consisted only of α type SiAlON. When fluorescence spectrum was measured with a spectrofluorophotometer, the peak wavelength was 600 nm, and the full width at half maximum was 85 nm. The specific surface area was 0.24 m$^2$/g.

Plural kinds of fluorescent substances (Examples 1 to 3, Comparative Examples 1 to 5) were prepared by the same preparation method as that described above with changing α+β and the O/N ratio in the composition formula of the fluorescent substance $(Ca_\alpha, Eu_\beta)(Si, Al)_{12}(O, N)_{16}$, as shown in Table 1. For the fluorescent substance of Comparative Example 1, the starting material powders except for the α type SiAlON were mixed in a stoichiometric ratio and used.

TABLE 1

| | Designed Composition | | | Measured value | Fluorescence characteristics - excited at 455 nm | | | | | Specific surface area |
|---|---|---|---|---|---|---|---|---|---|---|
| | | | | | Peak wavelength | | | Emission efficiency | Crystalline phase | |
| | α | β | α + β | O/N | (nm) | Chromaticity x | Chromaticity y | | | (m²/g) |
| Example 1 | 1.67 | 0.08 | 1.75 | 0.03 | 600 | 0.566 | 0.430 | 63.2 | α-SiAlON single phase | 0.24 |
| Comparative Example 1 | 1.67 | 0.08 | 1.75 | 0.03 | 600 | 0.564 | 0.432 | 54.2 | α-SiAlON single phase | 0.42 |
| Example 2 | 1.67 | 0.04 | 1.71 | 0.02 | 598 | 0.552 | 0.443 | 62.7 | α-SiAlON single phase | 0.24 |
| Comparative Example 2 | 0.96 | 0.04 | 1.00 | 0.02 | 594 | 0.542 | 0.452 | 55.0 | α-SiAlON single phase | |
| Comparative Example 3 | 2.46 | 0.04 | 2.50 | 0.04 | 602 | 0.562 | 0.433 | 51.8 | α-SiAlON, CaAlSiN$_3$ | |
| Example 3 | 1.96 | 0.04 | 2.00 | 0.03 | 592 | 0.549 | 0.447 | 61.0 | α-SiAlON single phase | 0.19 |
| Comparative Example 4 | 1.75 | 0.25 | 2.00 | 0.04 | 604 | 0.583 | 0.416 | 31.5 | α-SiAlON single phase | |
| Comparative Example 5 | 1.67 | 0.04 | 1.71 | 0.06 | 591 | 0.534 | 0.460 | 45.3 | α-SiAlON single phase | |

2. Measurement of Fluorescent Characteristics of Fluorescent Substances

Fluorescent characteristics of the fluorescent substances of Examples 1 to 3 and Comparative Examples 1 to 5 were measured by exciting them with excitation light of 455 nm. As the fluorescent characteristics of the fluorescent substances, total luminous flux emission spectra were measured with an integrating sphere using blue light isolated from light of a xenon lamp light source and having a wavelength of 455 nm as an excitation source, by means of a multichannel spectrometer, MCPD 7000, produced by Otsuka Electronics Co., Ltd. As for chromaticity, chromaticity coordinates CIEx and CIEy in the XYZ color system defined in JIS Z8701 were calculated from the emission spectra data in the wavelength range of 465 to 780 nm by the method similar to that of JIS Z8724. Quantum efficiency was calculated according to the method of Okubo et al. (Journal of the Illuminating Engineering Institute of Japan, Vol. 83, No. 2, Heisei 11 (1999), 87-93 pages, "Quantum efficiency measurement of NBS standard fluorescent substance"). The results are shown in Table 1.

The specific surface area of the substance of Example 1 was 0.24 m²/g, whereas that observed in Comparative Example 1 where the α type SiAlON was not used as a raw material for production of the fluorescent substance was as large as 0.42 m²/g. From comparison of these results of Example 1 and Comparative Example 1, it can be seen that if the specific surface area is larger than 0.35 m²/g, a high luminous efficiency of 60% or more cannot be obtained.

As for the content of Ca and Eu (α+β), from comparison of the results of Example 2 (α+β=1.71), Comparative Example 2 (α+β=1) and Comparative Example 3 (α+β=2.5), it can be seen that if α+β is not larger than 1.5, it is difficult to obtain fluorescence with a peak wavelength of 595 nm or longer, and if an α type SiAlON of which α+β exceeds 2.2 is produced, the secondary phase adversely affecting the fluorescence characteristics comes to be more easily formed.

Further, as for the solid solution amount of Eu (value of β), from comparison of the results of Example 3 (β=0.04) and Comparative Example 4 (β=0.25), it can be seen that even with the same α+β, if the solid solution amount of Eu (value of β) exceeds 0.2, the fluorescence peak wavelength shifts, and luminous efficiency is reduced.

Furthermore, from comparison of the results of Example 2 (O/N ratio=0.02) and Comparative Example 5 (O/N ratio=0.06), it can be seen that the ratio of oxygen and nitrogen is preferably 0.04 or smaller for both the peak wavelength and the luminous efficiency.

3. Production of Light-Emitting Device

The fluorescent substance of Example 1 in an amount of 20 parts by weight was mixed with 100 parts by weight of a thermosetting silicone resin, and kneaded to obtain a uniform mixture, and the mixture was injected with an injector into a lamp house 3 on which an electrode 5 and a blue LED (gallium nitride type compound semiconductor LED, peak emission wavelength: about 460 nm) were fixed. Then, the resin was cured by heating at 150° C. for 1 to 4 hours and thereby fixed to produce such a light-emitting device as shown in FIG. 1.

With flowing an electric current of 350 mA through the blue LED of the above light-emitting device, total luminous flux was measured with an integrating sphere, and an emission spectrum was measured at an ambient temperature of 25° C. The emission spectrum is shown in FIG. 4. As the results, the total luminous flux was about 29 lm, the peak wavelength was 603 nm, and the full width at half maximum of the emission spectrum was 86 nm. Further, the integral value for the wavelength range of 500 nm or shorter corresponded to 0.33% of the total integral value. The chromaticity coordinates at the time of emission were x,y=0.5798, 0.4169, and it was confirmed that they were within the range of amber color used for on-vehicle turn signal lamps.

4. Evaluation of Temperature Characteristics

With flowing an electric current of 350 mA through the light-emitting device produced in the section 3 and a conventional AlGaInP semiconductor LED at a controlled ambient temperature, total luminous flux and chromaticity were measured with an integrating sphere. The results are shown in FIGS. 5 and 6. In FIG. 5, intensity of the luminous flux is represented in terms of relative intensity based on the luminous flux measured at an ambient temperature of 25° C. In FIG. 6, the region enclosed with a broken line represents the chromaticity range for direction indicator defined in ECE, and the region enclosed with an alternate long and short dash line indicates the CIE1971 spectrum locus.

As clearly seen from the results shown in FIG. 5, whereas the luminous flux of the AlGaInP semiconductor LED decreased in the high temperature region, the light-emitting device of the present invention showed little decrease of the luminous flux even in the high temperature region.

Further, as shown in FIG. 6, whereas the AlGaInP semiconductor LED showed a significant chromaticity change depending on change of ambient temperature, and it deviated from the chromaticity range for direction indicators, the light-emitting device of the present invention showed little chromaticity change even when the ambient environment became 100° C.

On the basis of these results, it was confirmed that the light-emitting device of the present invention could stably maintain the luminous flux, and show little change of chromaticity, even if it is used in a high temperature environment.

INDUSTRIAL APPLICABILITY

According to the present invention, there is provided a light-emitting device of amber color that can stably maintain luminous flux, and shows little chromaticity change even at a high temperature. This light-emitting device can be applied to lighting apparatuses for vehicles, and general amber color light sources, and it is especially suitable for lighting apparatuses for vehicles used at a high ambient temperature.

DESCRIPTION OF NOTATIONS

Figure 1:
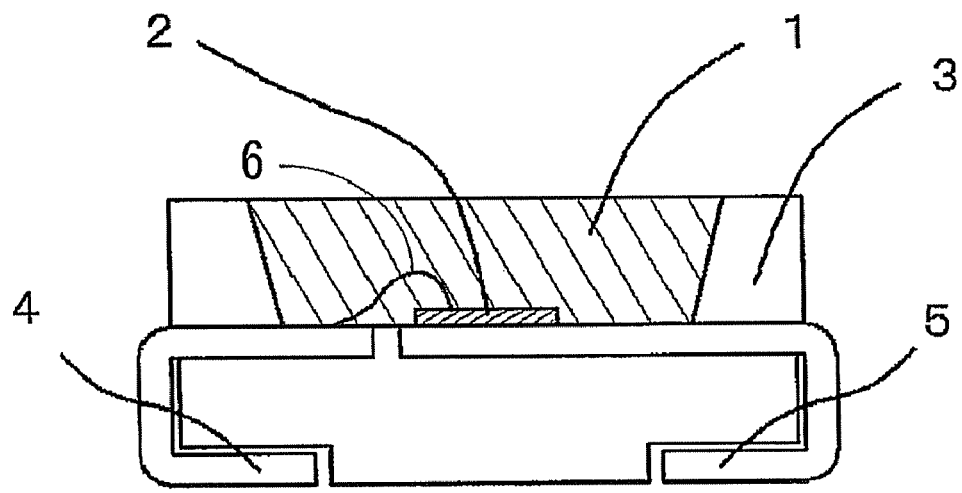
FIG. 1 A drawing showing an embodiment of the light-emitting device of the present invention FIG. 2 A drawing showing an embodiment of the lighting apparatus for vehicles of the present invention FIG. 3 A drawing showing an embodiment of a headlamp using the light-emitting device of the present invention FIG. 4 A drawing showing an emission spectrum of the light-emitting device of the example FIG. 5 A drawing showing temperature dependency of luminous flux of the light-emitting device of the example FIG. 6 A drawing showing temperature dependency of chromaticity of the light-emitting device of the example
Figure 2:
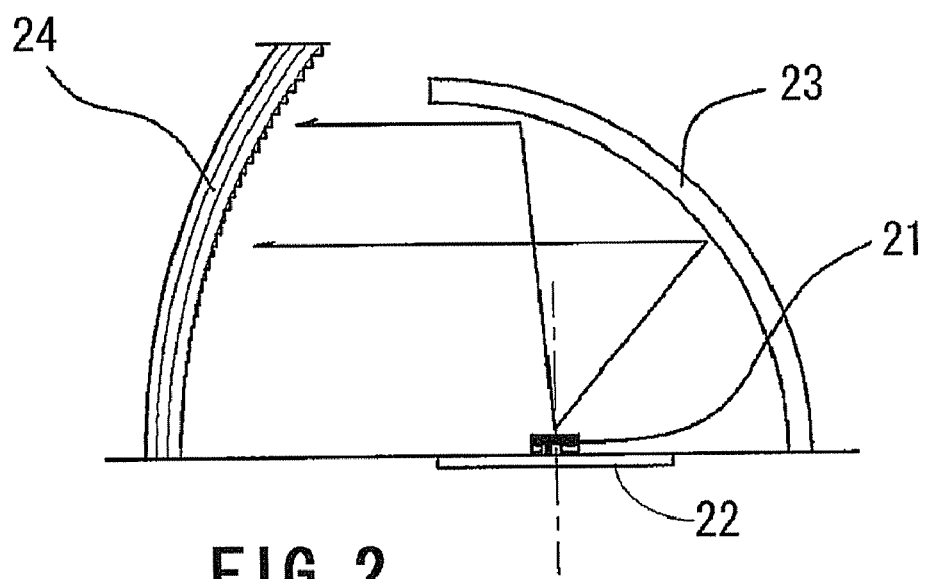
Figure 3:
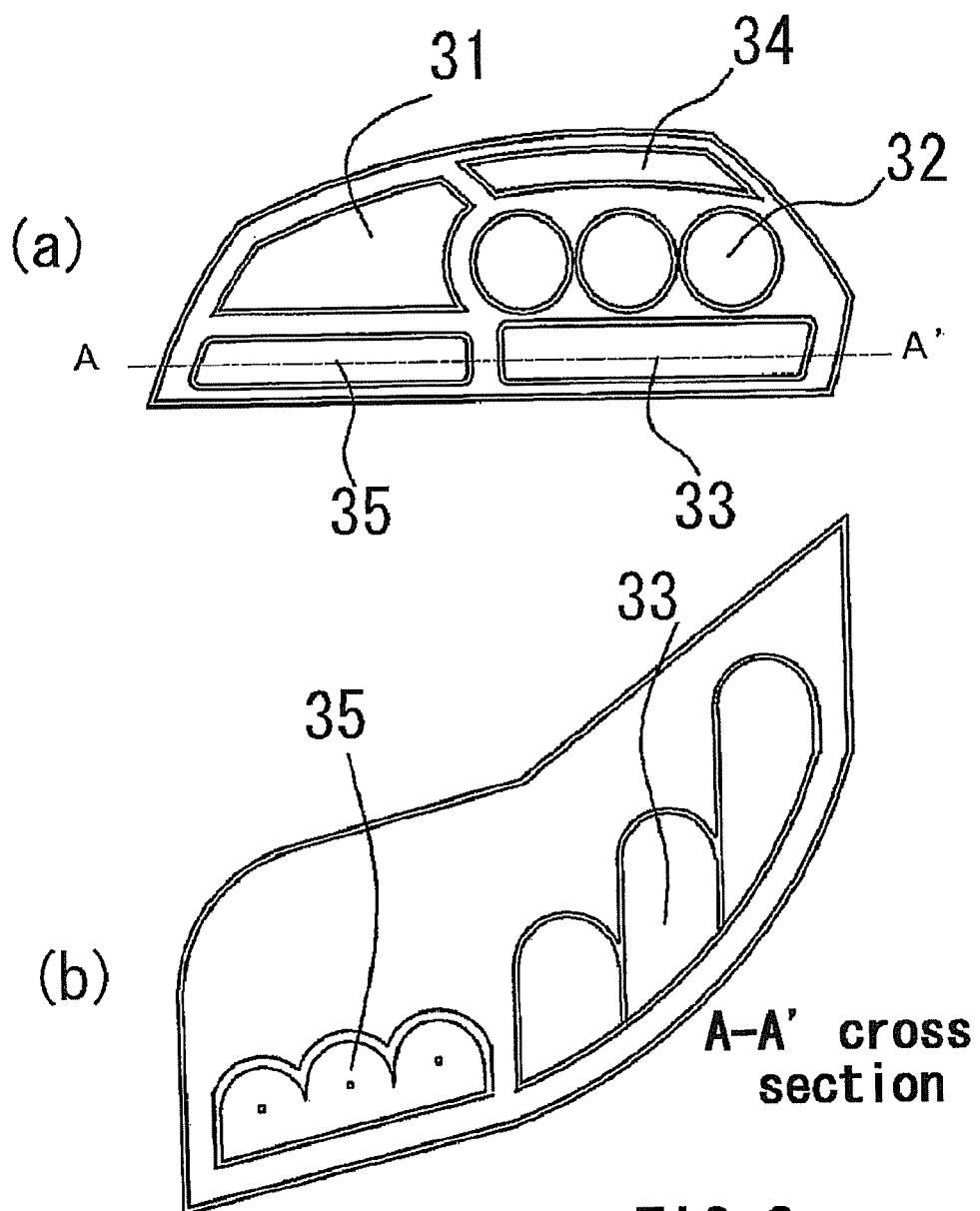
Figure 4:
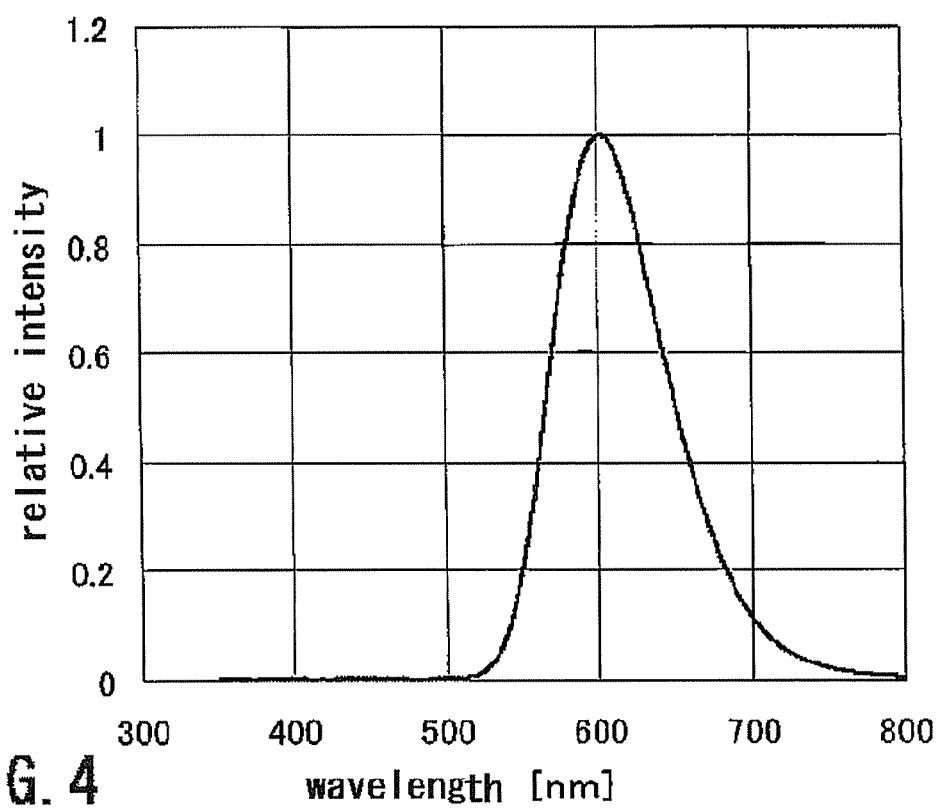
Figure 5:
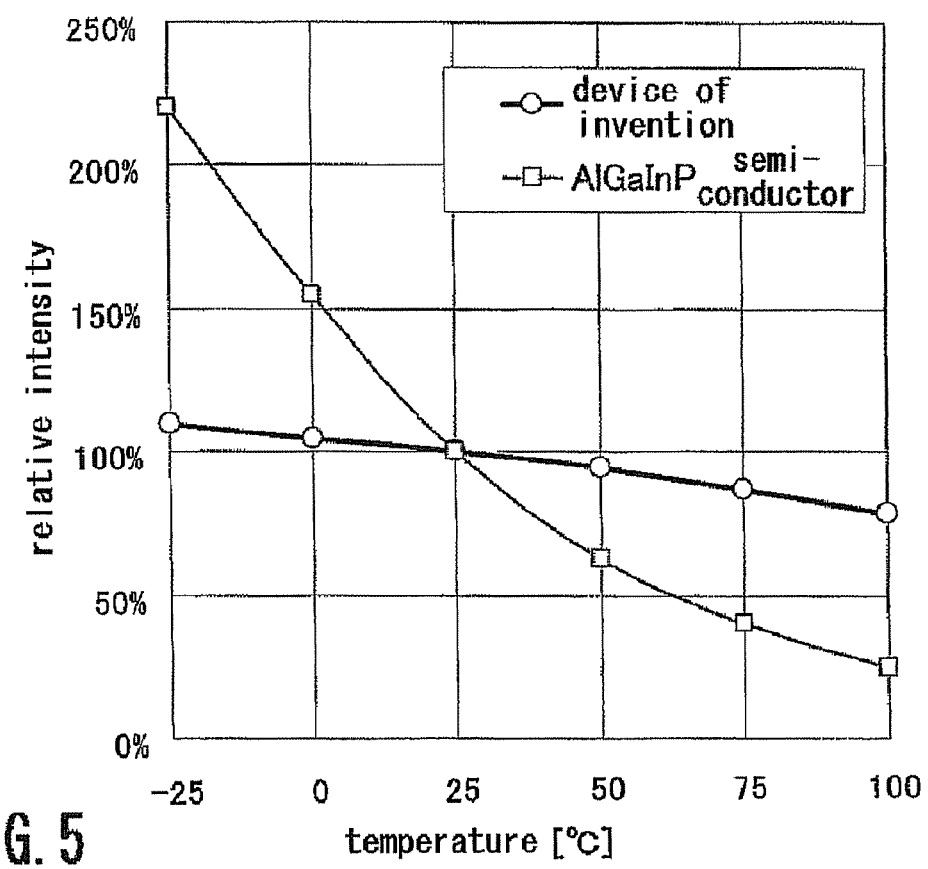
Figure 6:
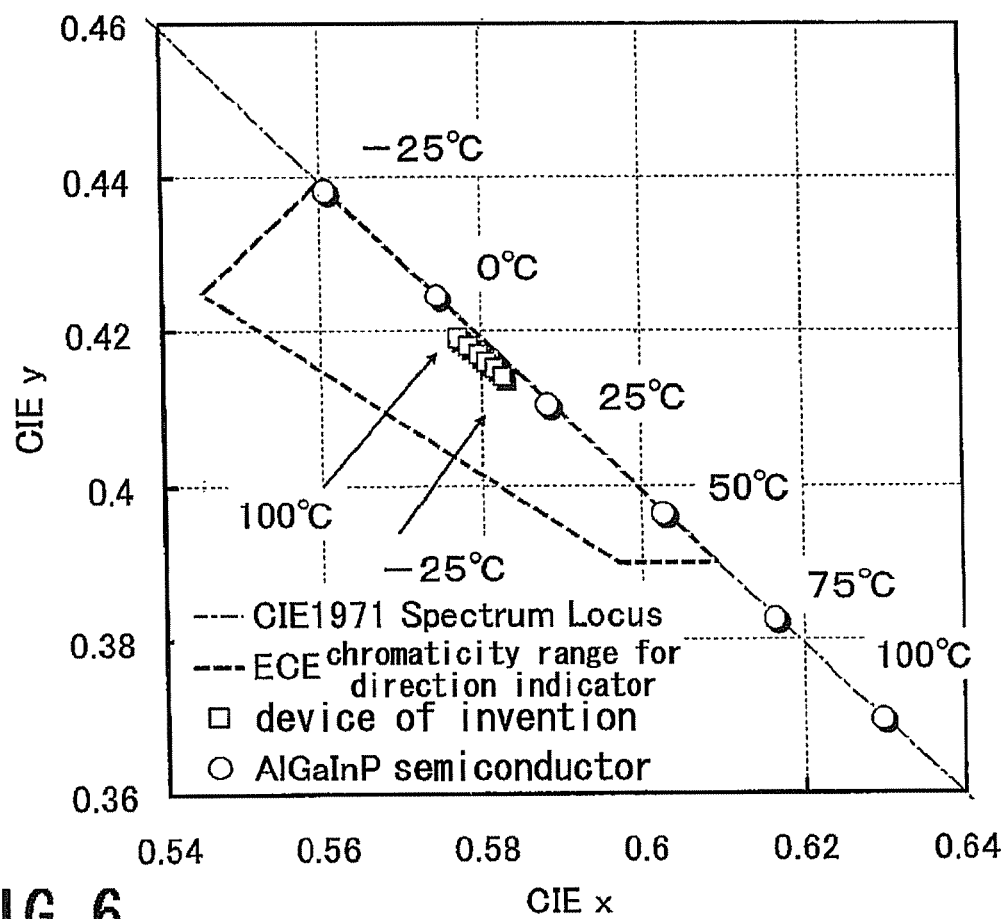

1 . . . resin, 2 . . . blue LED, 3 . . . lamp house, 4, 5 . . . electrode, 6 . . . conductive wire, 21 . . . light-emitting element, 23 . . . reflector, 24 . . . outer lens

The invention claimed is:

1. A light-emitting device comprising a light source which emits excitation light and a fluorescent substance which absorbs the excitation light to emit light in combination, wherein a fluorescent substance comprising an α type SiAlON represented by the general formula: $(Ca_\alpha, Eu_\beta)(Si, Al)_{12}(O,N)_{16}$ ($1.5 < \alpha+\beta < 2.2$, $0 < \beta < 0.2$, $O/N \leq 0.04$) as a main component is used as the fluorescent substance.

2. The light-emitting device according to claim 1, wherein chromaticity of light emitted by the light-emitting device is in the range defined as $x \geq 0.545$, $y \geq 0.39$, and $y \leq x - 0.12$ in terms of the chromaticity coordinates (CIE 1931).

3. The light-emitting device according to claim 1, wherein the excitation light emitted by the light source has an emission peak wavelength of 420 to 480 nm.

4. The light-emitting device according to claim 1, wherein area of a region of 500 nm or shorter in an emission spectrum of the light-emitting device consists of 5% or less of the total area of the emission spectrum.

5. The light-emitting device according to claim 1, wherein the main peak in the emission spectrum of the light-emitting device has a full width at half maximum of 100 nm or smaller.

6. A lighting apparatus for vehicles, which uses the light-emitting device according to claim 1.

7. A headlamp comprising the lighting apparatus according to claim 6.

8. A lighting apparatus for vehicles comprising a light-emitting element, a reflector for receiving and reflecting light from the light-emitting element, and a lens for irradiating the light reflected by the reflector to the outside, wherein the light-emitting device according to claim 1 is used as the light-emitting element.

9. The lighting apparatus for vehicles according to claim 8, wherein area of a region of 500 nm or shorter in an emission spectrum measured without using a color filter consists of 5% or less of the total area of the emission spectrum.

10. The lighting apparatus for vehicles according to claim 8, wherein the main light-emitting direction of the light-emitting element is substantially perpendicular to the main light-emitting direction of the lighting apparatus.

11. A light-emitting device comprising a light source which emits excitation light and a fluorescent substance which absorbs the excitation light to emit light in combination, wherein a fluorescent substance comprising an α type SiAlON represented by the general formula: $(Ca_\alpha, Eu_\beta)(Si, Al)_{12}(O,N)_{16}$ ($1.5 < \alpha+\beta < 2.2$, $0 < \beta < 0.2$, $O/N \leq 0.04$) as a main component and having a specific surface area of 0.1 to 0.35 $m^2/g$ is used as the fluorescent substance.

12. The light-emitting device according to claim 11, wherein chromaticity of light emitted by the light-emitting device is in the range defined as $x \geq 0.545$, $y \geq 0.39$, and $y \leq x - 0.12$ in terms of the chromaticity coordinates (CIE 1931).

13. The light-emitting device according to claim 11, wherein the excitation light emitted by the light source has an emission peak wavelength of 420 to 480 nm.

14. The light-emitting device according to claim 11, wherein area of a region of 500 nm or shorter in an emission spectrum of the light-emitting device consists of 5% or less of the total area of the emission spectrum.

15. The light-emitting device according to claim 11, wherein the main peak in the emission spectrum of the light-emitting device has a full width at half maximum of 100 nm or smaller.

16. A lighting apparatus for vehicles, which uses the light-emitting device according to claim 11.

17. A lighting apparatus for vehicles comprising a light-emitting element, a reflector for receiving and reflecting light from the light-emitting element, and a lens for irradiating the light reflected by the reflector to the outside, wherein the light-emitting device according to claim 11 is used as the light-emitting element.

18. A light-emitting device comprising a light source which emits excitation light and a fluorescent substance which absorbs the excitation light to emit light in combination, wherein at an environmental temperature in the range of −20° C. to 85° C., change of the total luminous flux is ±30% or smaller, and chromaticity of the emitted light is in the range defined as $x \geqq 0.545$, $y \geqq 0.39$, and $y \leqq x - 0.12$ in terms of the chromaticity coordinates (CIE 1931).

19. The light-emitting device according to claim 18, wherein at an environmental temperature in the range of −20° C. to 85° C., chromaticity change amount satisfies $\Delta x \leqq 0.03$ and $\Delta y \leqq 0.03$ in terms of change of the chromaticity coordinates (CIE 1931).

20. A lighting apparatus for vehicles, which uses the light-emitting device according to claim 18.

21. A lighting apparatus for vehicles comprising a light-emitting element, a reflector for receiving and reflecting light from the light-emitting element, and a lens for irradiating the light reflected by the reflector to the outside, wherein the light-emitting device according to claim 18 is used as the light-emitting element.

\* \* \* \* \*